United States Patent [19]
Zory, Jr. et al.

[11] Patent Number: 5,559,058
[45] Date of Patent: Sep. 24, 1996

[54] METHOD FOR PRODUCING NATIVE OXIDES ON COMPOUND SEMICONDUCTORS

[75] Inventors: Peter S. Zory, Jr., 2457 NW. 15th Pl., Gainesville, Fla. 32605; Douglas A. Hudson, Jr., Boulder, Colo.; Michael J. Grove, Fort Leavenworth, Kans.

[73] Assignee: Peter S. Zory, Jr., Gainesville, Fla.

[21] Appl. No.: 339,811

[22] Filed: Nov. 15, 1994

[51] Int. Cl.$^6$ ............................................. H01L 21/02
[52] U.S. Cl. .................. 437/237; 437/107; 437/126; 437/133; 437/132
[58] Field of Search .................. 437/237, 107, 437/126, 133, 132

[56] References Cited

U.S. PATENT DOCUMENTS

| | | | |
|---|---|---|---|
| 3,890,169 | 6/1975 | Schwartz et al. | 437/237 |
| 3,969,164 | 7/1976 | Cho et al. | 148/175 |
| 5,262,360 | 11/1993 | Holynyak et al. | 437/237 |

OTHER PUBLICATIONS

R. S. Burton et. al., Appl. Phys. Lett. 60, 1776, (1990) "Self–aligned native–oxide ridge–geometry $Al_xGa_{1-x}As$–GaAs quantum well heterostructure laser arrays".

A. Sher et. al., in J. Electronic Materials 23, 653, (1992) "Fabrication of n–Native Oxide/p–Zn Te Heterojunctions by the Anodic Oxidation of ZnTe MBE Layers".

T. Suda et. al. Jap. J. Appl. Phys. 25, L162, (1968) "Anode Oxidation of Zinc Phosphide".

K. Yokoyama et. al. in Plating and Surface finishing p. 62, Jul., (1982) "Advantages of Pulse Anodizing".

C. Tu and L. Y. Huang, Trans. IMF 65, 60 (1987) "Hard anodizing of 2024 aluminium alloy using pulsed DC and AC power".

C. W. Fischer and S. W. Teare, J. Appl. Phys. 67,2608, (1990).

*Primary Examiner*—R. Bruce Breneman
*Assistant Examiner*—Ramamohan Rao Paladugu
*Attorney, Agent, or Firm*—R. T. Hodgson

[57] ABSTRACT

A method of growing a native oxide on a compound semiconductor material, comprising contacting the compound semiconductor material with an oxygen containing fluid, and pulsing a current between the compound semiconductor material the fluid, is presented. A "traveling oxide" can be produced when the oxygen containing fluid etches the native oxide. To obtain smooth oxides when the compound semiconductor material contains layers of different material, the oxide growth is monitored, and the pulse parameters changed in response to the monitoring of the oxide growth.

20 Claims, 12 Drawing Sheets

Monolithic Laser Array

Fig. 2. Monolithic Laser Array

| |
|---|
| 500Å GaAs: p ++ |
| 50 Å GaAs: p |
| 250 Å $Al_{0.05}Ga_{0.95}As$-$Al_{0.6}Ga_{0.4}As$: p (graded) |
| 1.4 μm $Al_{0.6}Ga_{0.4}As$: p |
| 0.2 μm $Al_{0.6}Ga_{0.4}As$-$Al_{0.3}Ga_{0.7}As$: p- (graded) |
| 100 Å $Al_{0.08}Ga_{0.92}As$ SQW |
| 0.2 μm $Al_{0.3}Ga_{0.7}As$-$Al_{0.6}Ga_{0.4}As$: n- (graded) |
| 1.4 μm $Al_{0.6}Ga_{0.4}As$: n |
| 500 Å $Al_{0.6}Ga_{0.4}As$-$Al_{0.05}Ga_{0.95}As$: n (graded) |
| 0.25 μm GaAs: n+ |
| GaAs Substrate: n+ |

Fig. 7

| | | |
|---|---|---|
| GaAs:p++ | | .2 μm |
| AlGaAs:p+ | x=.6 | .6 μm |
| AlGaAs:p cladding layer | x=.6 | .5 μm |
| Graded AlGaAs | x=.6 to .3 | .2 μm |
| AlGaInAs QW | x=.09 | .0135 μm |
| Graded AlGaAs | x= .3 to .6 | .2 μm |
| AlGaAs:n cladding layer | x=.6 | 1.5 μm |
| AlGaAs:n | x=.15 | 1.0 μm |
| GaAs:n | | .5 μm |
| GaAs:n substrate | | |

Fig. 11

METHOD FOR PRODUCING NATIVE OXIDES ON COMPOUND SEMICONDUCTORS

BACKGROUND OF THE INVENTION

1. Field of the Invention

The present invention relates to a method of forming a uniform, stable, low strain native oxide layer on a compound semiconductor material. More specifically, the present invention forms the native oxide layer by a method of pulsed anodic oxidation at room temperature. The oxide layer forms much faster than the oxide layer formed from the prior art continuous oxidization, and has the feature of being able to travel into the compound semiconductor material. High quality oxides can be formed on compound semiconductor materials, and in particular, on gallium, aluminum, and indium containing compound semiconductor materials.

The present invention is also directed to devices using the native oxide layer, including electrical and optoelectronic devices such as transistors, capacitors, waveguides, and especially lasers.

The present invention relates to the masking and passivation of compound semiconductors using the native oxide that forms from the practice of present invention.

2. Description of the Prior Art

Silicon technology has far outstripped other semiconductor technologies because the silicon oxide can be produced cheaply and easily, and exhibits outstanding surface state and electrical properties. Group III–V semiconductors have been limited to uses where their high speed and ability to produce light are absolutely necessary. Group II–VI semiconductors have recently assumed importance because new and short wavelength lasers have been produced using ZnSe-based materials. An inexpensive and simple method of producing a high quality native oxide on such semiconductors would allow inexpensive dielectric insulation and isolation of devices from one another, and surface passivation, which would broaden the uses of such material.

A schematic drawing of the prior art fabrication procedure for a monolithic array of semiconductor laser diodes is shown in FIG. 1. A substrate 2 of n-type GaAs material has a number of layers grown epitaxially. The important cladding layers 6 of n-type AlGaAs and 7 of p-type AlGaAs surround an active layer 4 which normally has a lower bandgap than the cladding layers and may be composed of many layers of AlGaAs, GaAs, InGaAs, or other III–V semiconductor compounds. A layer of exposed and developed photoresist 8 is shown with openings 9 etched in the photoresist. Step b of the prior art procedure uses an etching step to etch vee grooves in the cladding layer 7, generally through the active layer 4 and into the other cladding layer 6. A blanket layer of insulating material 12 such as SiO2 is then deposited on the substrate. This step generally requires heating the wafer which can increase the defects generated by heating and cooling the many layers of different material. Another layer of photoresist is then deposited on the wafer, and is exposed and developed in an expensive alignment procedure to give the photoresist portions 14 covering the vee grooves 10. The SiO2 is then etched away from the areas between the vee grooves 10, the photoresist is stripped, and blanket metalization layers 18 and 20 are deposited over the front side and the back side of the wafer. The remaining oxide isolates each laser diode from its neighbor. In contrast, the fabrication of a monolithic array of semiconductor laser diodes using the method of the present invention is shown in FIG. 2, where pulsed anodic oxidization is used to produce trenches 22 covered with native oxide 24, saving the expensive lithography step and reducing the defect causing temperature excursions of the prior art.

Wet, high temperature methods of forming native oxides are retorted to in U.S. Pat. No. 5,262,360, hereby incorporated by reference, which patent teaches a method of wet chemical oxidation of aluminum containing III–V semiconductors at temperatures of greater than 375C. The thickness of the native oxide is substantially the same as, or less than, the thickness of that portion of the material converted to oxide. The index of refraction of the oxide material is about 1.57.

C. W. Fischer and S. W. Teare, in J. Appl. Phys. 67, 2608, (1990) have reported on the physical properties and growth mechanisms of anodic oxides on GaAs, and shown the advantages of using a glycol:water:acid (GWA) solution. Prior art publications suggest that native oxides produced by anodic oxidation on III–V semiconductors are unstable in the various washing, solvent materials, photoresist strippers, etc needed for modem device processing. R. S. Burton et. al., Appl. Phys. Lett. 60, 1776, (1990) is an example of a report that anodic oxides are apparently unstable with respect to subsequent processing. A. Sher el. al., in J. Electronic Materials 23, 653, (1992) have reported on fabrication of native oxide on ZnTe by anodic oxidation in water and methanolic solutions. T. Suda et. al. Jap. J. Appl. Phys. 25, L162, (1986) have reported on fabrication of native oxide on $Zn_3P_2$ by anodic oxidation in a 3% tartaric acid/propylene/glycol electrolyte. K. Yokoyama et. al. in Plating and Surface finishing page 62, July, (1982) have reported producing porous aluminum oxide material on aluminum alloys by changing the anodizing voltage by a maximum of 30% for times ranging from 10 seconds to 60 seconds. C. Tu and L. Y. Huang, Trans. IMF 65, 60 (1987) have reported cracked and rough surfaces using 60 Hz AC and DC pulses when anodizing 2024 Aluminum alloy The semiconductor art has produced a number of methods to form oxides of compound semiconductors, and recognizes a continuing need for a method of growing an improved, high quality native oxide compound semiconductors. The method should be simple, cost effective, low temperature, and produce the native oxide in a consistent and repeatable manner.

SUMMARY OF THE INVENTION

A new anodic oxidation method for growing high-quality native oxides on compound semiconductor material has been developed. The native oxide grows an order of magnitude faster than prior art methods. The native oxide does not degrade under conditions of normal use and atmospheric exposure, and can withstand processing. The native oxides formed from the present invention exhibit better performance when used in laser devices and result in lower threshold currents for these devices than prior art laser devices. High quality native oxides have been obtained on a wide variety of compound semiconductors including a number of quantum well laser epitaxiallayered structures.

In accordance with the present invention, a method of growing a native oxide on a conducting compound semiconductor material is provided. The method comprises contacting the sub gate with an oxygen containing fluid, and pulsing current between the conducting substrate and the fluid, to convert at least a portion of the semiconductor material to the native oxide.

In further accordance with the present invention, a "traveling oxide" can be produced when an oxygen containing fluid which etches the native oxide is used.

In further accordance with the subject invention, the native oxides that forms from the present method of the present invention have utility in the masking and passivation of compound semiconductor materials.

BRIEF DESCRIPTION OF THE DRAWINGS

FIG. 7 shows a sketch of sample L473 AlGaAs laser material

FIG. 11 shows a sketch of sample E1795 (GRIN-SCH) AlGaInAs construction.

DETAILED DESCRIPTION OF THE INVENTION

The present invention provides a method of forming a high-quality native oxide from a compound semiconductor material. The native oxide formed by the present invention is formed an order of magnitude faster than those formed by prior art methods. The native oxide formed by the present invention is especially useful in the fabrication of electrical and optoelectronic devices, including capacitors, transistors, waveguides, and lasers such as stripe-guided, (both gain guided and index guided) lasers and surface emitting lasers. The native oxide formed by the method of the present invention can also be used to define patterns on the surfaces of Group III–V and of Group II–VI semiconductors to create a variety of surface topographies and configurations.

Conventional prior art anodization of compound semiconductor materials produces poor quality, non uniform material when the current density is high. We have found that, with the correct choice of electrolyte, pulsed anodic oxidation produces oxide an order of magnitude faster than the prior art continuous anodization. The oxide produced shows excellent resistance and sufficiently low surface state density to allow production of high quality lasers and monolithic diode array laser bars.

The method of the present invention entails exposing a conducting compound semiconductor material to an oxygen containing fluid, and pulsing current between the conducting substrate and the fluid, to convert at least a portion of the conducting semiconductor material to the native oxide. The conducting fluid preferably contains liquid water, although the present method is not limited to a water solution and a number of other fluids which are known in the art, such as N-methylacetamide with $NH_4OH$, ammonium pentaborate, methanol, $H_2O_2$, or oxygen containing plasmas might be used.

Figure 3:
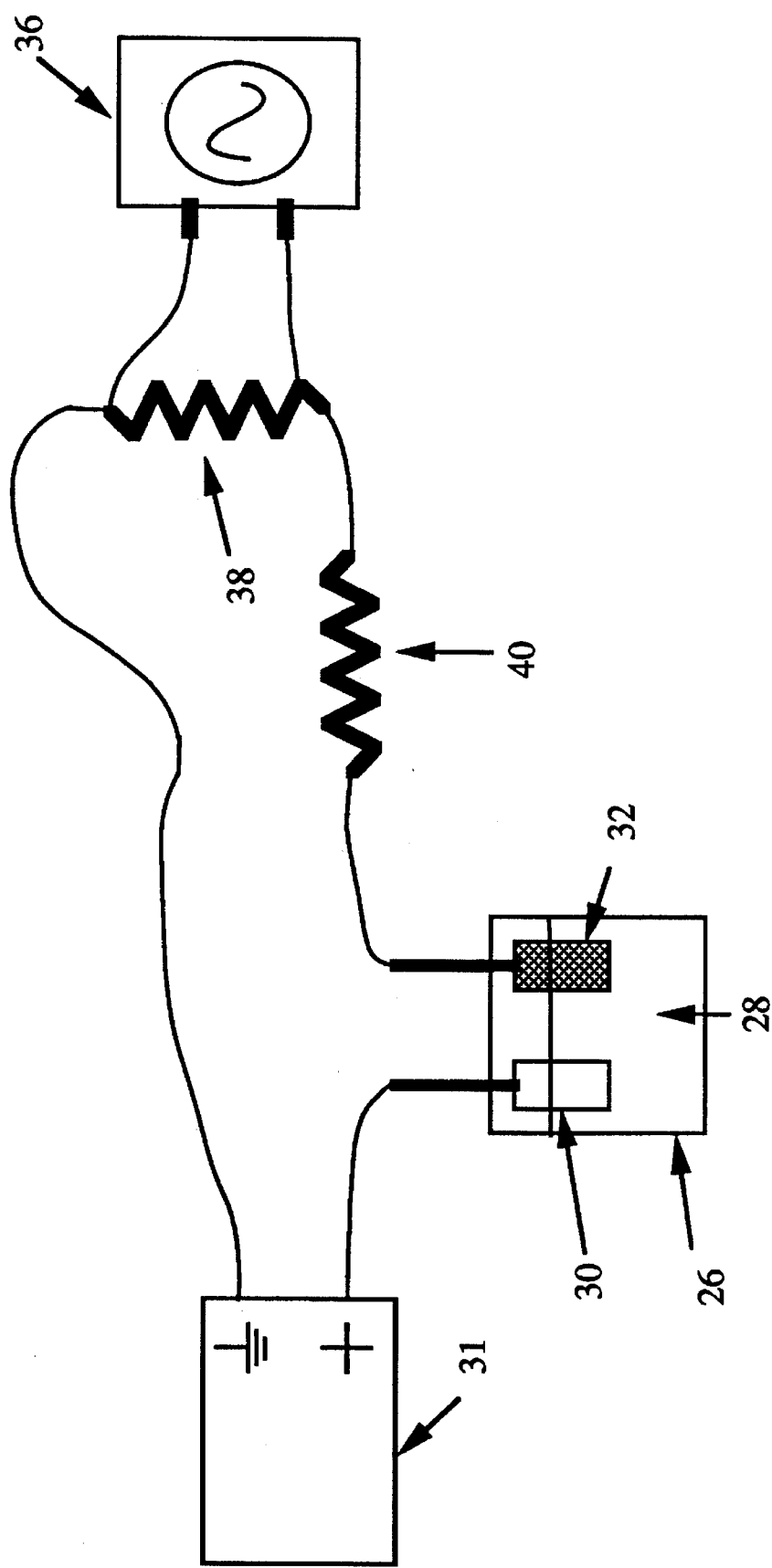
FIG. 3 shows a laboratory set up for practicing the method of the present invention.

A laboratory set up for practicing the method of the present invention is shown in FIG. 3, where a beaker 26 is filled with a liquid solution 28 containing oxygen. The preferred solution is water, with an acid (for example, phosphoric acid) added to increase the conductivity of the solution. The most preferred solution contains ethylene glycol, which controls the diffusion of the ions and molecules in the solution and can be used to change the relative growth and etch rates of the anodic oxide produced by the method of the subject invention. The $OH^-$ anion participates in oxidation, and the concentration has to be high at the semiconductor surface. However, the $H2PO4)^-$ ion acts as an etchant for III–V semiconductor oxide material, so its concentration should be low at the semiconductor liquid interface. Since the OH-ion is smaller, it will be transported faster through the viscous solution and greater oxidation and less etching will occur. The most preferred ratio of glycol water acid (GWA) is 40:20:1. However, the solution works well over a wide range of water to glycol ratios and pH of the solution. The glycol to water ratio can be used to change the ratio of oxide growth to oxide etch, and determines along with the pulse length, pulse voltage, and pulse repetition rate the equilibrium thickness of the native oxide. The semiconductor material 30 to be oxidized is immersed in the solution, and electrically connected to a source of pulsed current 31. A cathode 32, generally of platinum or other noble metal, is immersed in the solution 28. The cathode 32 is connected to the pulse generator 31 through a variable resistor 40 and a small (10 ohms) resistor 38. The voltage across resistor 38 is monitored by an oscilloscope 36. Voltage and current traces of the pulsed oxidation of the semiconductor material are shown schematically in FIG. 4. The pulse width, repetition rate, and pulse amplitude were varied to obtain optimal settings for uniform oxide growth. The settings were pulse width about 100 microseconds to 10 milliseconds, the repetition rate from 10 to 200 Hz, a pulse amplitude from 50 to 150 volts, and a current density from 5 to 150 $mA/cm^2$. At the longer pulse lengths, the current must be set lower to avoid non uniform oxidation. More preferred pulse widths were between 200 and 5000 microseconds. Even more preferred pulse widths were between 100 and 1000 ms. Most preferred pulse conditions were pulse widths about 500 to 800 microseconds, the repetition rate from 30 to 100 Hz, a pulse amplitude from 110 to 130 volts, and a current density from 50 to 130 $mA/cm^2$.

Figure 4:
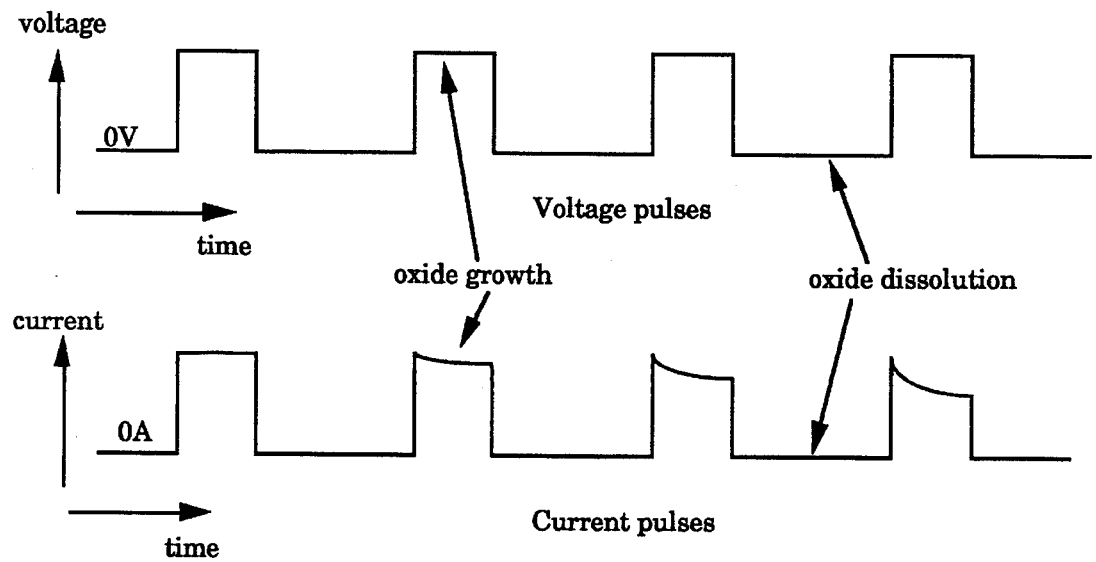
FIG. 4 shows typical voltage and current pulses when practicing the method of the present invention.
Figure 5:
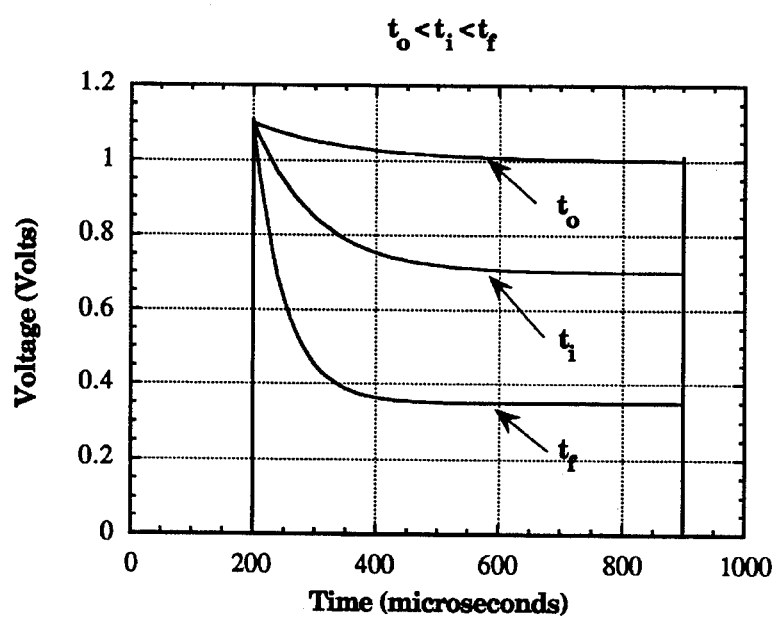
FIG. 5 shows typical current pulses as a function of time for different stages in the practice of the method of the present invention.

As expected, the current flow in the circuit decreases as the oxide becomes thicker. However, the magnitude of the leading edge of the voltage pulse, as read across the resistor 38 by the oscilloscope 36, does not change with time. Representative oscilloscope traces shown in FIG. 4 show that the initial pulse, $t_0$, an intermediate pulse in the oxidation sequence $t_i$, and the last pulse of the oxidizing sequence $t_f$ all have the same magnitude of leading edge. The trailing edge decreases with time corresponding to the growth of the oxide. The pulse shape can be explained by modeling the solution/oxide/semiconductor system as a Schottky barrier diode which changes to an MOS capacitor as the oxide thickens. At the beginning of each voltage pulse, the capacitance of the oxide acts to short out the oxide resistance. After the capacitor charges, the current decreases to a steady state value within the pulse. As the oxide thickens, the resistance increases, and the steady state current decreases from pulse to pulse. As long as the voltage pulse width is long enough for the capacitor to achieve a quasi steady state, this performance is invariably repeated. The oxide growth terminates when the oxide resistance is large enough to render the available voltage pulse insufficient to drive the anodic reaction. When this happens, the trailing edge of the pulse no longer decreases with time and the shape of the pulse looks like the pulse labeled $t_f$ in FIG. 5. This pulse shape variation provides convenient, real time monitoring of the oxide thickness. If the initial voltage pulse amplitude is not large enough to begin the reaction, no oxide will form and the pulse will remain rectangular.

When the pulse anodization occurs in a solution which etches the oxide, a "traveling oxide" effect occurs. After a time, the current pulse attains a steady state shape, and the oxide "sinks into" the surface of the semiconductor. The oxide thickness remains constant in time, the oxide dissolves at the same average rate as it forms, and the semiconductor material is removed as sketched in FIG. 6 where a trench 22 is formed in the cladding layer 6 extending through the active layer 4 to the lower cladding layer 7. The native oxide 24 is left on the sides and bottom of the trench 22. At the end of the process, a ridge of ridge height $h_r$ 23 is left under the protecting photoresist 8. The oxide etch rate has been measured to be 16 nm/min for $Al_{0.6}Ga_{0.4}As$ native oxide formed by the method of the present invention.

Figure 6:
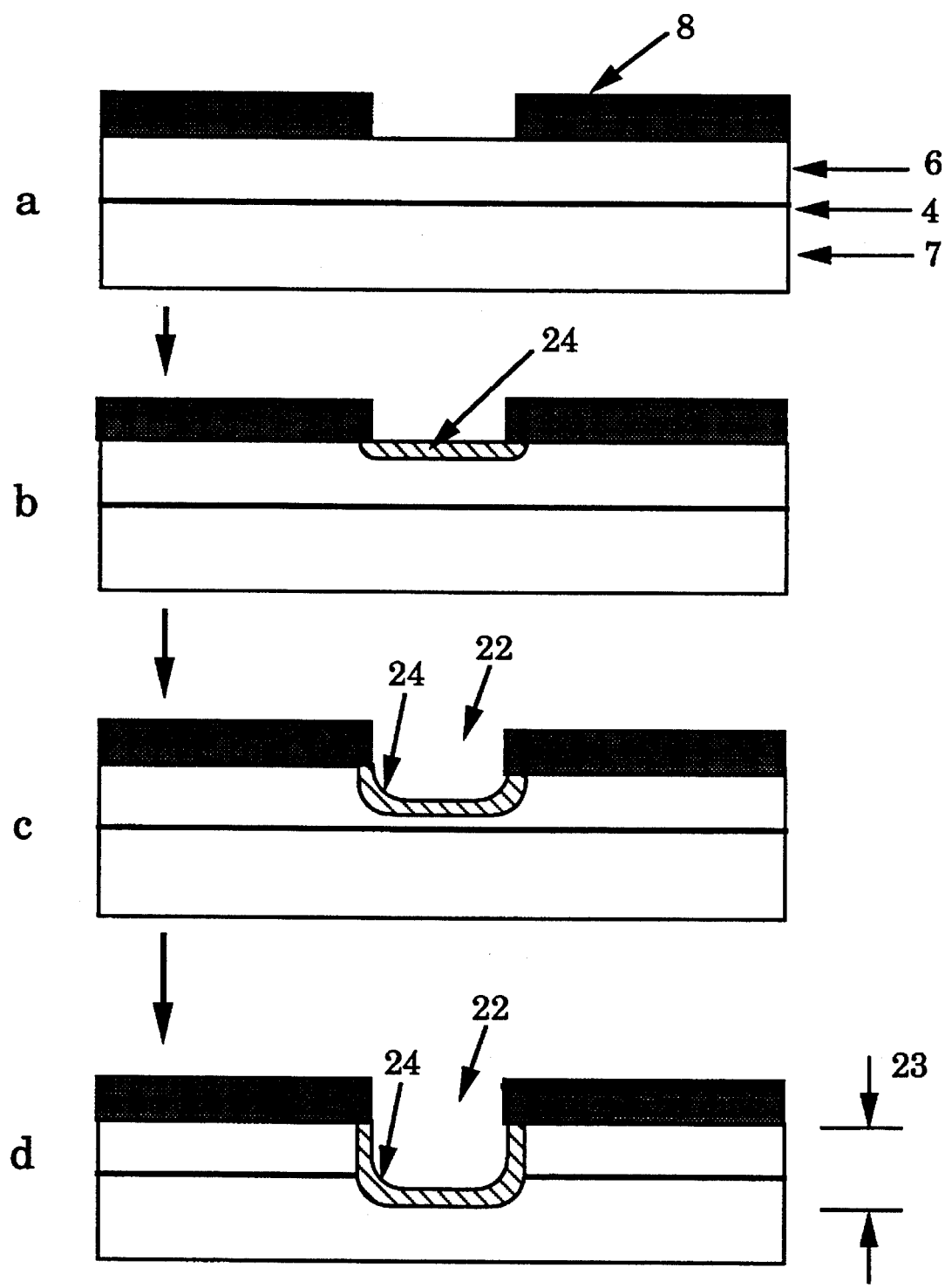
FIG. 6 shows a time evolution of isolation trenches formed using the method of the present invention.

FIG. 6 shows an uncomplicated structure having 2 cladding layers and 1 active layer. In many laser type structures, there are in fact many different layers including grading layers, doping layers, etc. In general, each of these layers etches and oxidizes at a different rate given the same solution and the same pulse parameters. Ideally, one would set the etch and oxidation conditions differently for each layer and each material to produce a smooth and optimal film. In practice, this would entail changing the pulse amplitude, repetition rate, pulse length and/or pulse rate during the anodization to produce a trench 22 with smooth sidewalls and smooth bottom.

Pulsed anodic oxides were produced in n-type and p-type GaAs bulk wafers, and in p-type AlGaAs, p-type $Ga_{0.5}In_{0.5}As$, n-type InP, p-type GaSb, p-type ZnTe, and in many layered combinations of III–V and II–VI semiconductor material on GaAs and GaSb substrates, Attempts to oxidize semi-insulating GaAs were unsuccessful, even with current densities as high as 200 mA/cm$^2$. We believe the lack of success with the semi-insulating GaAs has to with the lack of charge carriers in the semiconductor and the barriers at the interfaces, both of which are affected by doping levels.

Typical oxidation times were from 5 to 10 minutes with the pulse duration of 700 microseconds, repetition rates of 50 Hz, pulse amplitude of 120 V, and current densities of 120 mA/cm$^2$. Deposited oxides ranged from 0.1 to 0.15 micron in thickness.

Researchers have raised questions about the stability of anodic oxides to subsequent processing. It is true that these oxides are easily dissolved in basic solutions such as most photoresist developers. We have developed a technique that uses a metal ion free photoresist developer (Shipley Microposit MF 319) which does not rapidly dissolve the oxide, and allows further processing on top of the oxide including lift off processing. The anodic oxides are stable in deionized water, TCE, acetone, and methanol.

The following examples are given to illustrate the scope of the present invention. Since the Examples are given for illustrative purposes only, the invention should not be limited thereto.

EXAMPLE 1

A single $Al_xGa_{1-x}As$/GaAs wafer with layers sketched in FIG. 7 was used to fabricate a series of lasers using the method of the present invention and using prior art methods of deposition of $SiO_2$ for comparison purposes. Lasers were made of various ridge heights to determine the effect the ridge height had on threshold current, slope efficiency, near field, and far field of the lasers. To reduce the effects of thermal gradients and other transients, most of the tests were done with a pulsed drive voltage. Several lifetime tests of the lasers operating continuously were done to evaluate the method of the present invention.

The material selected for use was a single quantum well graded index separate confinement heterostructure (SQW-GRINCH) structure grown by Metal Organic Chemical Vapor Deposition (MOCV). For convenience, this sample is referred to as L473. The top layer is a high conductivity p type layer to facilitate ohmic contacts. The first graded p layer is a barrier reduction layer. The purpose of the barrier reduction layer is to reduce the potential drops caused by abrupt discontinuities in the conduction and valence band edges that occur by growing GaAs on $Al_{0.6}Ga_{0.4}As$.

The 1.4 micron thick layer of $Al_{0.6}Ga_{0.4}As$ serves as an optical confinement layer due to its lower index of refraction, approximately 3.27 at a lasing wavelength of 801 nm. In contrast, $Al_{0.3}G_{0.7}As$ has a refractive index of 3.45. The active layer of $Al_{0.08}Ga_{0.92}As$ has an index of approximately 3.64. The second graded p type region provides one side of the potential well for confining the careers in the quantum well active layer. The n layers perform the same functions as the corresponding layers in the p region.

L473 was cleaved into several pieces, and each piece was processed into lasers of various pulse ridge heights. Oxidation times of 3, 10, 20, 60 and 90 minutes were chosen. Semiconductor consumption rates of about 20–22 nm per minute had been established on bulk wafers. Based on this rate, the 3 minute anodization would consume only the high conductivity cap; the 10 minute sample would be the time at which the terminal oxide thickness would form, the 20 minute sample would consume a portion of the $Al_{0.6}Ga_{0.4}As$ optical cladding layer so it should begin to effect the index guiding properties of the laser; the 60 minute sample would have a ridge height of approximately 1.2 micron, which is comparable with conventional ridge guide devices; and the 90 minute sample would come close to the active layer so we could observe the effects of careers in the active layer interacting with the anodic oxide. A 40:20:1 GWA solution was used, with a pulse repetition rate of 50 Hz, a pulse length of 700 microseconds, pulse voltage of 120 volts, and a current density approximately 90 mA/cm$^2$. The mask used to define the laser stripes had feature widths of 5, 50, and 100 microns on 500 micron centers. The 5 micron stripes were used for this experiment. The oxidation was performed on the samples with parameters listed in Table 1. Samples 4 and 5 showed a difference in the shape of the trailing edge of the pulse at about 35 minutes after the start of the oxidation. We believe this occurs because the oxidation rate is a function of the chemical composition and doping. As the chemical composition changed, the rate of oxide growth slowed, and the relative etch rate to oxide growth rate ratio changed. The oxide which had been a light blue color was now turning purple or dark brown which indicates a thinner oxide. In order to keep the same oxide thickness, the voltage applied was raised so that the same blue color oxide was obtained at the end of the process. In production the color of the oxide could be monitored continuously and kept at the same color to give uniform oxide thickness. The current density shown in table 1 is the initial current density for samples 4 and 5. After anodization, the ridge height was measured for using a Dektak II profiler, and the oxide thickness was measured by stripping the oxide and remeasuring the ridge height. The final oxide thickness, ridge height, and etch rate are tabulated in Table I.

TABLE 1

Pulse Anodization Parameters and Results

| sample | surface area ($cm^2$) | Duration (minutes) | Current Density ($mA/cm^2$) | Oxide Thickness (nm) | Ridge Height (nm) | Etch Rate (nm/min) |
| --- | --- | --- | --- | --- | --- | --- |
| 1 | .97 | 3 | 89.7 | 78 | 153 | 51 |
| 2 | 1.04 | 10 | 86.3 | 127 | 277 | 27.7 |
| 3 | .95 | 20 | 91.6 | 153 | 429 | 21.5 |
| 4 | 1.13 | 60 | 86.0 | 87 | 1,177 | 19.6 |
| 5 | .99 | 90 | 87.9 | 104 | 1,597 | 17.7 |

The samples were lapped to a thickness of 100 microns, and n-side metallization was done. The p-side metallization was done through a lift off mask to make individual electrical contact to each stripe laser for testing in bar form. The lift off would not be necessary if the sample were to be cleaved into individual laser chips, or used as multiple laser bars. The pulsed anodic oxide is stable in the Shipley Microposit MF 319 developer and the acetone and methanol used to lift off the metal.

Figure 8:
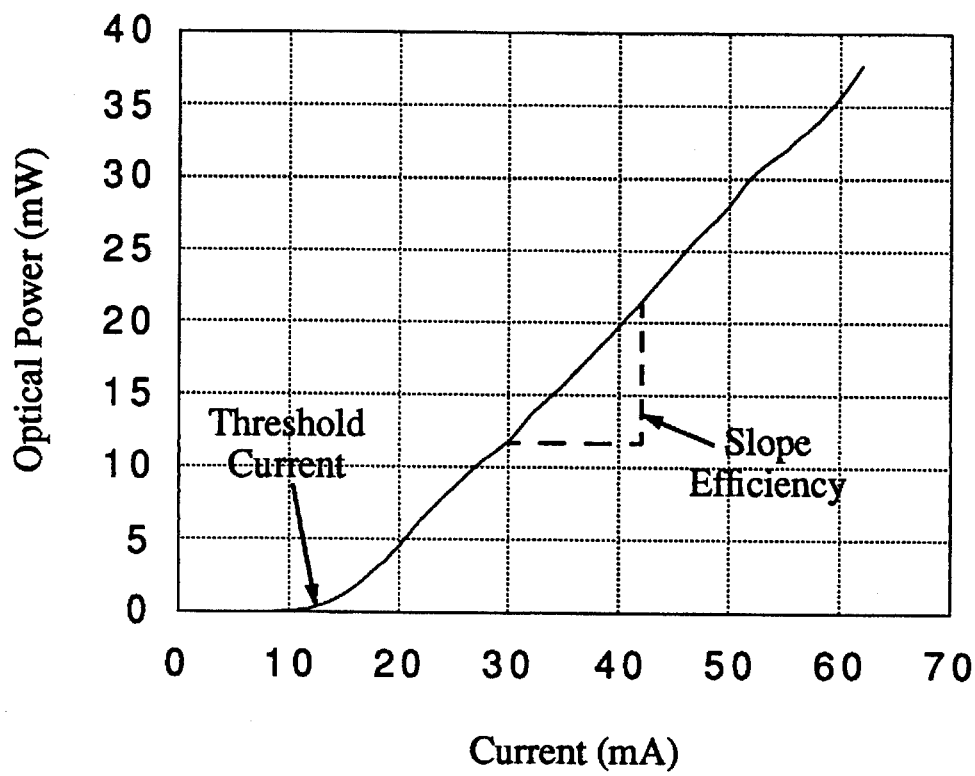
FIG. 8 shows a typical Power vs Current curve for a laser produced by the method of the present invention.

After metallization, the lasers were cleaved into cavity lengths of 500 microns using standard scribe and roll techniques. Some bars were further cleaved into 500 micron by 500 micron chips for mounting on small copper heat sink blocks for CW testing. Threshold, slope efficiency, and leakage current were measured using 0.5 msec pulses at low repetition rate to reduce the effects of heating and other transients. A typical power vs current curve is shown in FIG. 8 for a laser of the sample 5 group. Results are shown in Table 2. No slope efficiency is shown for samples 1–3, since they are gain guided lasers which do not have a linear power vs current curve at high power levels.

TABLE 2

Threshold Current and Slope Efficiency

| sample | Ridge Height (nm) | Average $I_{th}$ (mA) | Standard Deviation $I_{th}$ (mA) | Average $\eta_s$ (W/A) | Standard Deviation $\eta_s$ (W/A) |
| --- | --- | --- | --- | --- | --- |
| 1 | 153 | 38.4 | 2.4 | N/A | N/A |
| 2 | 277 | 28.5 | 1.3 | N/A | N/A |
| 3 | 429 | 27.1 | 3.1 | N/A | N/A |
| 4 | 1177 | 13.8 | 2.1 | .592 | .051 |
| 5 | 1597 | 14.5 | 1.5 | .740 | .101 |

Figure 9:
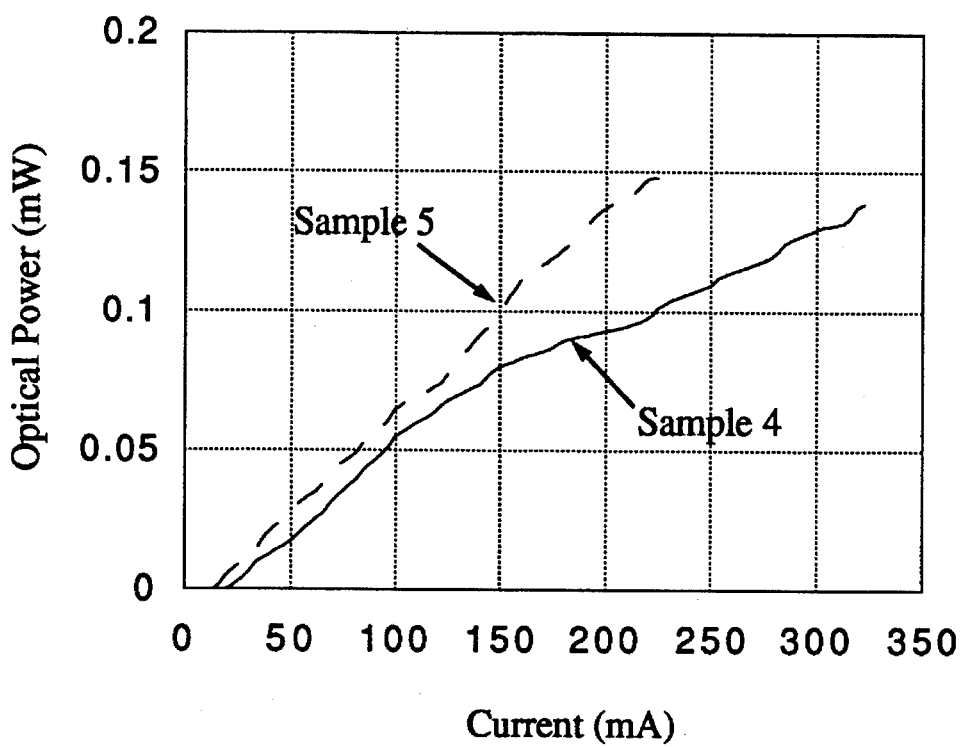
FIG. 9 shows high Power vs Current curves for two samples produced by the method of the present invention.

High voltage rollover in the Power vs current curves is a sign of leakage through the insulator in index guided lasers. Samples 4 and 5 were tested up to facet blow out caused by catastrophic optical damage in the facets of the laser. If the lasers slope efficiency is linear up to facet blow out, the oxide is as good as it needs to be. FIG. 9 shows sample 5 to be linear up to the facet blow out, while sample 4 is linear to 150 mA. One reason for the rollover of sample 4 could be that the laser has a small amount of gain guiding. The increased ridge height of sample 5 is sufficient to eliminate the gain guiding component.

The strata distributions due to the stresses produced in the production of the ridge guided lasers can be measured by measuring the degree of polarization of the lasers. Devices with native oxides produced by the method of this invention of 100 nm and 175 nm thickness were measured to have no difference in the degree of polarization, and hence no appreciable stain is present. The strain could also be measured with an infrared polariscope. The lack of stress and strain caused by the method of the present invention is important for laser diode reliability, and especially for II–VI laser reliability.

EXAMPLE 2

AiGaInAs Laser Diode Laser Bars

Figure 10:
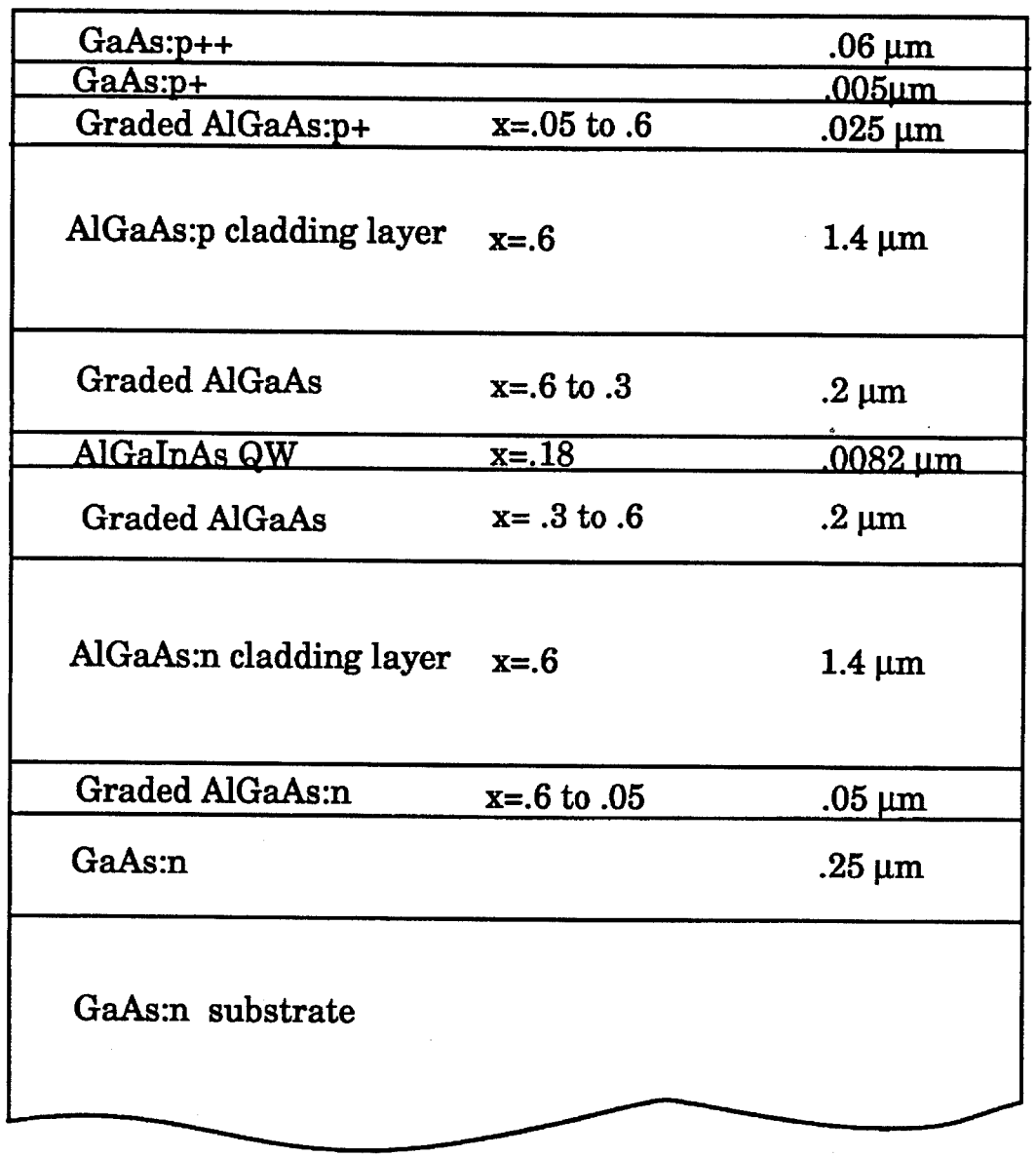
FIG. 10 shows a sketch of sample L362 (GRIN-SCH) AlGaInAs laser material.

A laser wafer with a AlGaInAs quantum well, denoted L362, which is sketched in FIG. 10, was divided in two. One half the wafer was processed into gain guided laser diode bars by the method of the present invention as shown in FIGS. 6a–c, the other half was processed into bars of 100 micron wide by 500 micron long lasers by a prior art process of depositing $SiO_2$, opening 100 micron wide slots in the $SiO_2$, and metalization. Ridge heights of 200 nm and oxide thicknesses of 100 nm were used for the anodic oxide lasers. The threshold currents $I_{th}$ and differential quantum efficiencies (DQE) are given in Table 3.

TABLE 3

Threshold Currents and Differential Quantum Efficiencies for L362

| Device type | $SiO_2$ insulation | pulsed anodic oxide insulation |
| --- | --- | --- |
| Threshold current $I_{th}$ | 114.2 mA | 98.7 mA |
| DQE | 42.6% | 44.1% |

EXAMPLE 3

AlGaInAs Laser Diodes

A laser wafer with a AlGaInAs quantum well, denoted E1795, which is sketched in FIG. 11, was divided in two. One half the wafer was processed into gain guided laser diode bars by the method of the present invention as shown in FIGS. 6a–c, the other half was processed into bars of 100 micron wide by 500 micron long lasers by a prior art process of depositing $SiO_2$, opening 100 micron wide slots in the $SiO_2$, and metalization. Ridge heights of 200 nm and oxide thicknesses of 100 nm were used for the anodic oxide lasers. The threshold currents $I_{th}$ and differential quantum efficiencies (DQE) are given in Table 4.

TABLE 4

Threshold Currents and Differential Quantum Efficiencies for E1795

| Device type | $SiO_2$ insulation | pulsed anodic oxide insulation |
| --- | --- | --- |
| Threshold current $I_{th}$ | 139.6 mA | 108 mA |
| DQE | 41.9% | 44.2% |

EXAMPLE 4

$(AlGa)_{0.5}In_{0.5}P$ Visible Lasers

Figure 12:
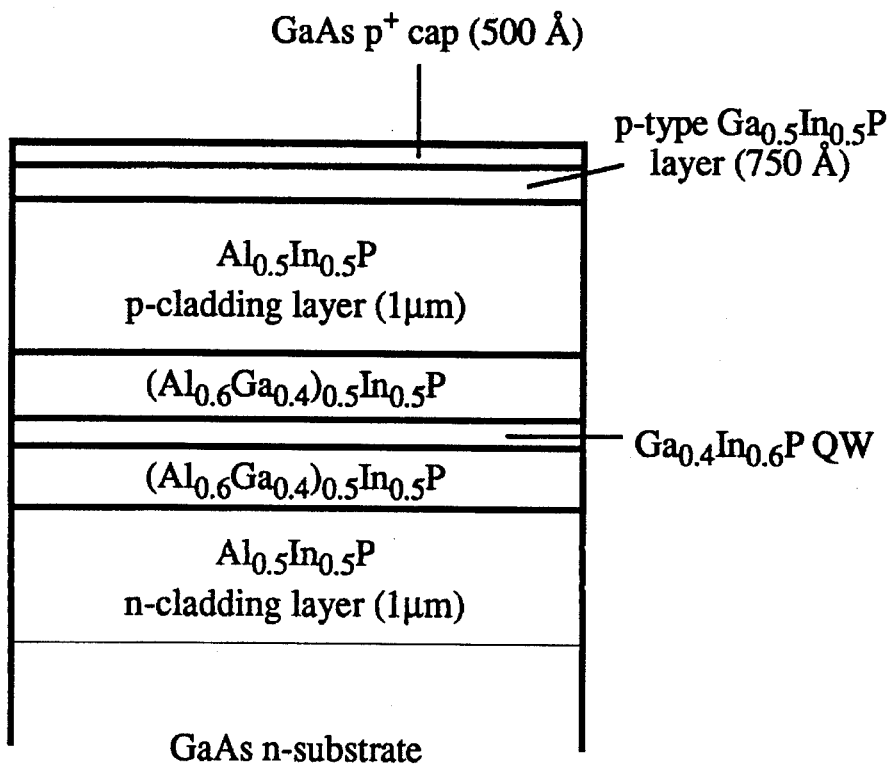
FIG. 12 shows a sketch of AlGaInP laser material.

A laser wafer sketched in FIG. 12 was processed by the method of this invention to form a 120 nm thick oxide layer with a resultant ridge height of 86 nm. The oxide was found to be unstable when exposed to ambient air for several hours. There was no "travelling oxide" because the GWA solution did not etch the oxide when the pulse was off. We discovered that we could make a stable oxide, however, by reversing the polarity of the pulses. In the reversed current mode, the oxide etched and we could make a ridge 200 nm high, with a 120 nm thick oxide layer terminating in the AlInP cladding layer using a cycle of three polarity flips. In a production mode, the positive voltage pulse could be followed by a negative pulse to both grow and dissolve the oxide at a constant rate. In fact, a thin oxide could be used at the beginning of the process which would grow the oxide faster, and the etching of the oxide could be controlled by the reversed current. At the end of the process, the etch rate could be slowed down and the oxide thickness could be increased to the required value. This oxide was stable after exposure to air and baking at 150C for one hour.

Figure 13:
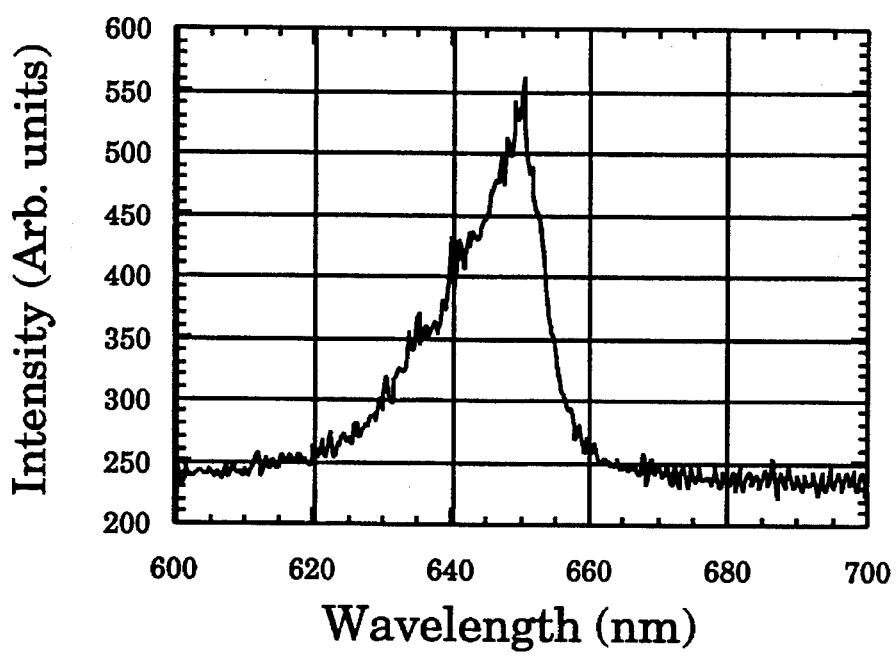
FIG. 13 shows a pulsed anodic oxidation luminescence (PAL) spectrum from the AlGaAsP material

During the anodization process, we found that red light was emitted from the portion of the wafer undergoing anodization. When the oxidation process first begins, no light is emitted. After 45 seconds, the emission starts and increases until the oxide reaches its final thickness, where the light emission saturates. The spectrum of the light was measured and is given in FIG. 13. The spectrum is similar to the photoluminescence spectrum and is blue-shifted with respect to the lasing wavelength. This data can be used to predict the lasing wavelength. We found that the light is emitted after the anodizing pulse, and surmise that the charged capacitor formed by the wafer, the oxide, and the GWA solution drives a reverse current into the wafer. This current forms electron hole pairs which recombine in the active layer to emit light. In fact, when the current was reversed by changing the polarity on a wafer with no oxide, the light was emitted continuously, with no etching or apparent damage to the wafer. This suggests that the phenomenon could be used as a simple diagnostic tool to check the active layer uniformity and to check for defects which would trap the electron hole pairs and reduce the light emission. Presently, the material must be scanned with a laser to detect such non uniformities and defects. The comparison of the Pulsed Anodization Luminescence (PAL) and the Photoluminescence (PL) is shown in Table 5.

TABLE 5

Comparison of PL and PAL and Laser Wavelength data for $(AlGa)_{0.5}In_{0.5}As$ Laser

|  | Peak Wavelength (nm) | Half width (nm) |
| --- | --- | --- |
| PAL | 650 | 15 |
| PL | 649 | 16 |
| Laser | 665 |  |

EXAMPLE 5

AlGaAsSb Based Laser Material

Figure 14:
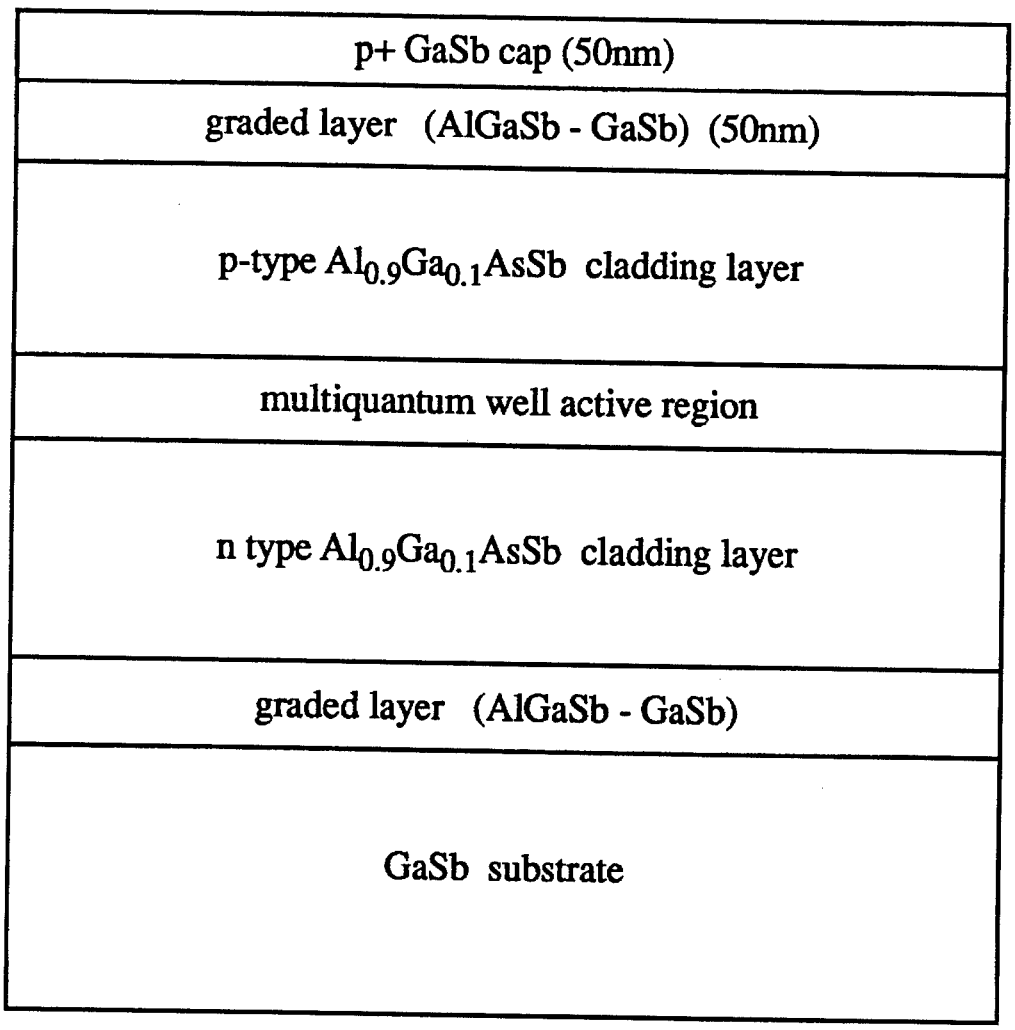
FIG. 14 shows a sketch of sample 92-019 AlGaAsSb based laser material.

A laser wafer sketched in FIG. 14 was processed to produce stripe lasers operating at a wavelength near 2 microns. Oxide layer thicknesses of 120 nm were produced in 5 minutes using the method of the present invention. The oxides are particularly robust and stable, and do not change color after baking for 1 hour at 120C or after exposure in air for several months. Prior art processing methods produce more strain in the devices than those produced by the method of the present invention and are much more complicated to produce. The lasers have thresholds about 10% lower than those processed from the same wafer by prior art methods.

EXAMPLE 6

II–VI Laser Material

Figure 15:
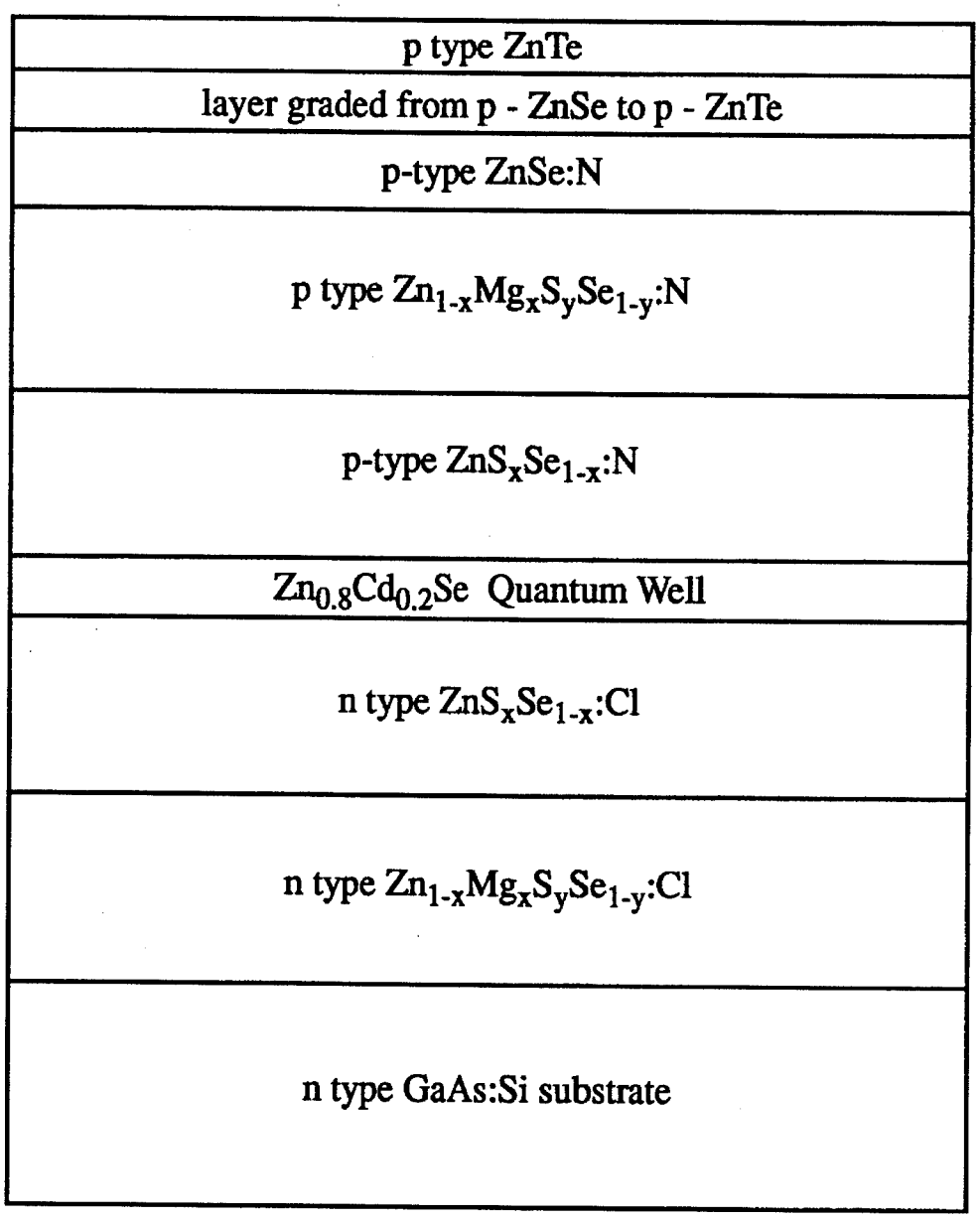
FIG. 15 shows a sketch of sample 871 II–VI laser material.

A wafer with a layer graded from p++-ZnTe to ZnSe sketched in FIG. 15 was anodicallly oxidized in GWA solution, using the method of the invention. The current pulses showed a build up of an insulating layer, presumably of undoped ZnO. When a 90% ethylene glycol, methanol, and KOH to raise the pH of the solution to 10 was used as the solution, with a pulsed current of 100 $mA/cm^2$, ridge heights of 2 microns were produced in 7 minutes. The oxide was a orange color. In this sample, after 3 minutes, the current was reversed, and the entire surface of the sample produced green light as expected. After about 5 seconds, the current was again reversed to complete the trenches. In this case, again, the luminescence could be used as a simple diagnostic for the quality of the material, the composition of the active area, and especially for the presence of defects. The material exibits green light luminesence with no oxide under reverse current, and shows the usual build up of the luminescence under the pulsed anodic oxidation after the end of each oxidizing current pulse.

Figure 1:
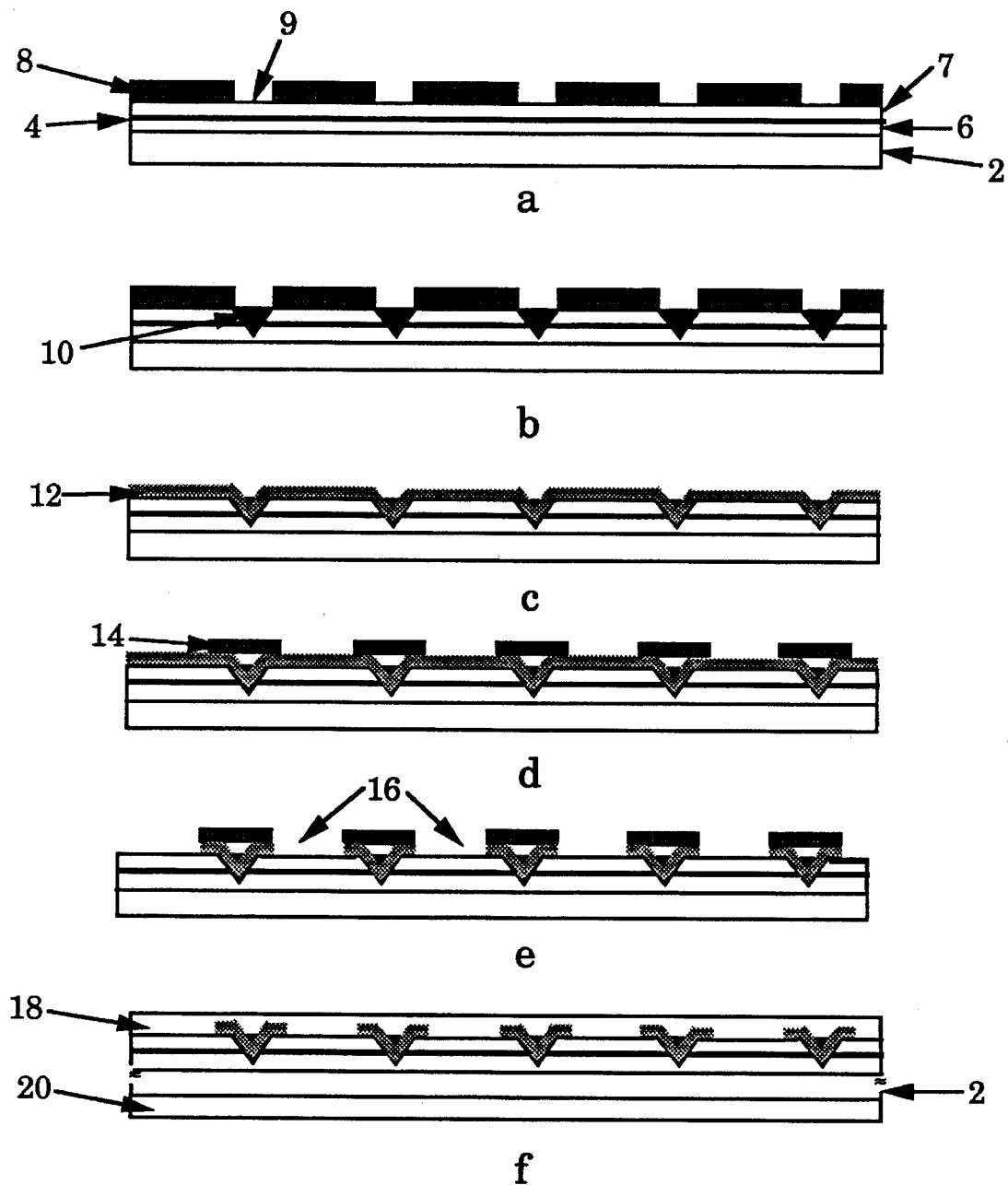
FIG. 1 shows the prior art method of isolating laser devices from each other in a production of monolithic laser diode arrays.
Figure 2:
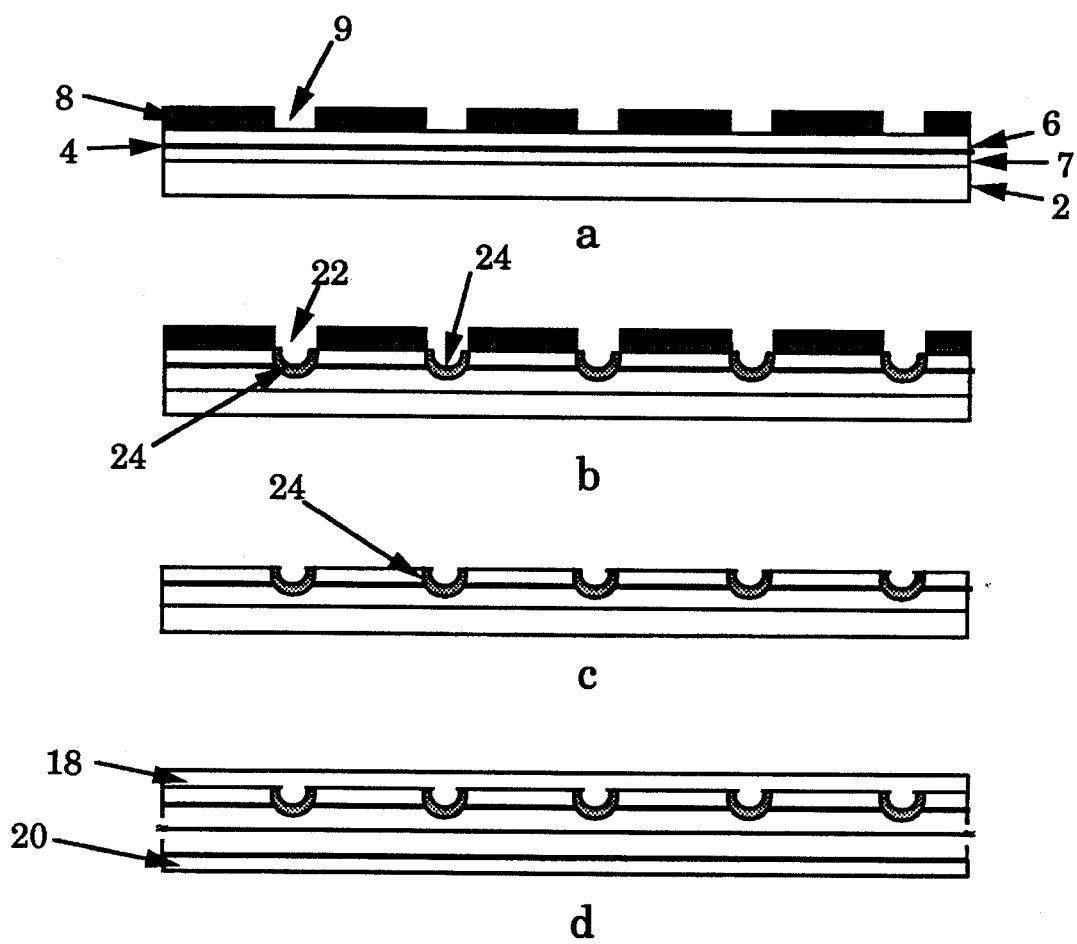
FIG. 2 shows a method of isolating laser devices from each other in a production of laser diode arrays using the method of the present invention.

In the II–VI materials presently used for laser devices, defects grow from a small beginning and propagate into the active region and destroy the laser. We could use the "traveling oxide" to trench around the device area and stop defects from propagating to an active area. If all the material contained in the multilayered epitaxially grown material was trenched to the substrate wafer, which has many fewer defects than the II–VI layers, there would be far fewer "initiation" places in reach of the active device, since the defect would have to be located just under the device. The process outlined in FIG. 2 could be continued until the trench 22 extends all the way through the lower cladding layer 7, and through whatever other layers used for grading purposes exist, until the trench extends to the substrate 2.

Another possibility exists, of trenching to a depth and leaving a relatively wide stripe of semiconductor material, and then using another photolithography step to define a relatively narrower stripe of semiconductor material, and etching shallower trenches to form ridge or gain guided lasers which are again protected and insulated by the native oxide material.

What is claimed is:

1. A method for producing native oxides on a multilayer compound semiconductor material, the multilayer compound semiconductor material comprising a substrate and a plurality of layers of compound semiconductor materials attached to the substrate, comprising:

contacting the compound semiconductor material with an electrically conducting oxygen containing fluid; and pulsing a plurality of electrical current pulses between the fluid and the compound semiconductor material.

2. The method of claim 1, wherein the compound semiconductor material is a III–V compound semiconductor material.

3. The method of claim 1, wherein compound semiconductor material is a II–VI compound semiconductor material.

4. The method of claim 1, wherein the current pulses have a time duration less than 10 ms.

5. The method of claim 4, wherein the current pulses have a time duration less than 1 ms.

6. The method of claim 1, wherein the current density pulsed between the oxygen containing fluid and the compound semiconductor material is greater than 5 mA/cm$^2$.

7. The method of claim 6, wherein the current density is greater than 10 mA/cm$^2$.

8. The method of claim 7, wherein the current density is greater than 50 mA/cm$^2$.

9. The method of claim 8, wherein the current pulses have a time duration less than 1 ms.

10. The method of claim 9, wherein the compound semiconductor material is chosen from the group consisting of III–V semiconductor materials and II–VI semiconductor materials.

11. The method of claim 1, wherein the oxygen containing fluid etches the compound semiconductor material native oxide.

12. A method for producing native oxides on a multilayer compound semiconductor material, the multilayer compound semiconductor material comprising a substrate and a plurality of layers of compound semiconductor materials attached to the substrate, comprising:

contacting the compound semiconductor material with an electrically conducting oxygen containing fluid;

pulsing at least one first electrical pulse current between the fluid and the compound semiconductor material; and pulsing at least one second electrical pulse current between the fluid and the compound semiconductor material.

13. The method of claim 12, wherein the first electrical pulse and the second electrical pulse have opposite polarities.

14. The method of claim 12, wherein the first electrical pulse current is greater than 50 mA/cm$^2$.

15. The method of claim 14, wherein the first electrical pulse current duration is less than 1 ms.

16. The method of claim 15, wherein the compound semiconductor material is a III–V semiconductor material.

17. The method of claim 16, wherein the III–V semiconductor material contains indium.

18. The method of claim 14, wherein the compound semiconductor material is a II–VI semiconductor material.

19. A method for producing native oxides on a multilayer compound semiconductor material, the multilayer compound semiconductor material comprising a substrate and a plurality of layers of compound semiconductor materials attached to the substrate, comprising:

contacting the compound semiconductor material with an electrically conducting oxygen containing fluid;

pulsing a plurality of electrical pulse currents between the fluid and the compound semiconductor material;

monitoring the production of the oxide; and adjusting the current pulse in response to the monitoring of the production of the oxide.

20. The method of claim 19, wherein the current pulses have a time duration of less than 1 ms.

\* \* \* \* \*